United States Patent
Cho et al.

(10) Patent No.: US 8,344,401 B2
(45) Date of Patent: Jan. 1, 2013

(54) LIGHT EMITTING DEVICE, LIGHT EMITTING DEVICE PACKAGE AND LIGHTING SYSTEM INCLUDING THE SAME

(75) Inventors: Hyun Kyong Cho, Seoul (KR); Hyun Don Song, Incheon (KR); Chang Hee Hong, Seoul (KR); Hyung Gu Kim, Jeonju-si (KR)

(73) Assignee: LG Innotek Co., Ltd., Seoul (KR)

( * ) Notice: Subject to any disclaimer, the term of this patent is extended or adjusted under 35 U.S.C. 154(b) by 220 days.

(21) Appl. No.: 12/724,791

(22) Filed: Mar. 16, 2010

(65) Prior Publication Data

US 2010/0230685 A1 Sep. 16, 2010

(30) Foreign Application Priority Data

Mar. 16, 2009 (KR) ........................ 10-2009-0022055

(51) Int. Cl.
*H01L 33/00* (2010.01)
(52) U.S. Cl. .............................. 257/98; 257/99; 257/100
(58) Field of Classification Search ............. 257/98–100
See application file for complete search history.

(56) References Cited

U.S. PATENT DOCUMENTS

| | | | | |
|---|---|---|---|---|
| 5,793,062 | A | 8/1998 | Kish, Jr. et al. | 257/98 |
| 6,429,462 | B1 | 8/2002 | Shveykin | 257/95 |
| 2003/0077847 | A1 | 4/2003 | Yoo | 438/22 |
| 2004/0115845 | A1 | 6/2004 | Pan et al. | 438/22 |
| 2005/0280352 | A1* | 12/2005 | Lai | 313/498 |
| 2006/0011935 | A1 | 1/2006 | Krames et al. | 257/99 |
| 2006/0209395 | A1* | 9/2006 | Sasaoka | 359/344 |
| 2007/0164298 | A1 | 7/2007 | Kim et al. | 257/94 |
| 2007/0241362 | A1 | 10/2007 | Han et al. | 257/100 |
| 2008/0111139 | A1 | 5/2008 | Chae et al. | 257/79 |
| 2010/0176418 | A1 | 7/2010 | Muraki et al. | 257/103 |

FOREIGN PATENT DOCUMENTS

| | | |
|---|---|---|
| EP | 1 158 585 A1 | 11/2001 |
| EP | 1 798 781 B1 | 6/2007 |
| JP | 2008-124254 A | 5/2008 |
| KR | 10-2004-0043102 A | 5/2004 |
| KR | 10-0604562 B1 | 7/2006 |
| KR | 2006-0125079 A | 12/2006 |
| KR | 10-0752721 B1 | 8/2007 |
| KR | 2008-0043649 A | 5/2008 |
| WO | WO 2009/028860 A2 | 3/2009 |

OTHER PUBLICATIONS

European Search Report dated Nov. 8, 2010 issued in Application No. 10 15 6535.
Korean Office Action dated Nov. 19, 2010 issued in Application No. 10-2009-0022055.
Korean Notice of Allowance dated Jul. 26, 2011 issued in Application No. 10-2009-0022055.

* cited by examiner

*Primary Examiner* — Samuel Gebremariam
(74) *Attorney, Agent, or Firm* — KED & Associates, LLP

(57) ABSTRACT

Provided are a light emitting device, a light emitting device package and a lighting system including the same. The light emitting device (LED) comprises a light emitting structure comprising a second conductive type semiconductor layer, an active layer, and a first conductive type semiconductor layer and a first electrode over the light emitting structure. A portion of the light emitting structure is sloped at a predetermined angle.

19 Claims, 8 Drawing Sheets

[FIG. 1]
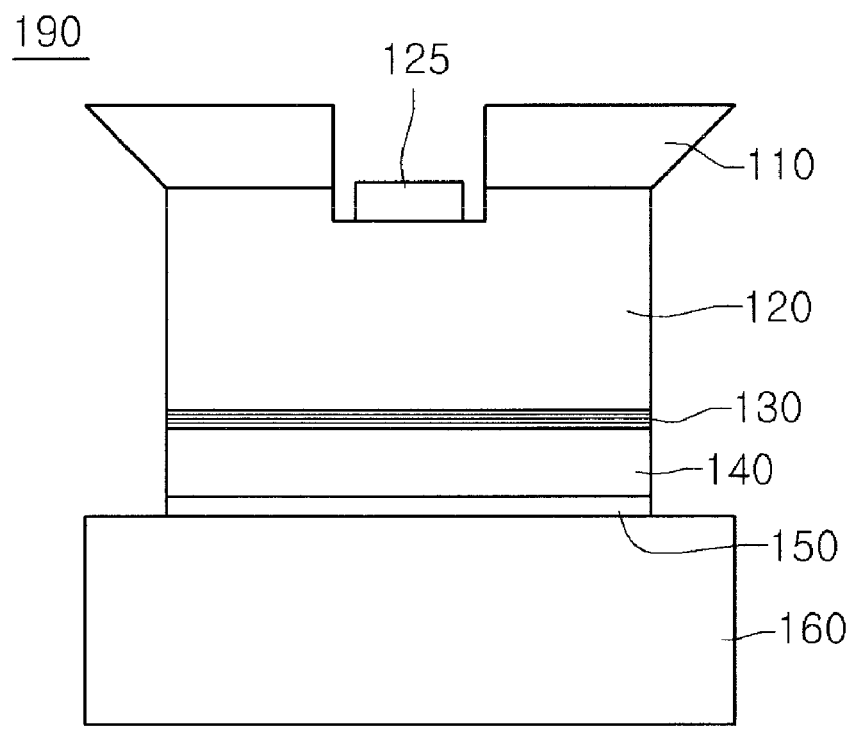
[FIG. 2]
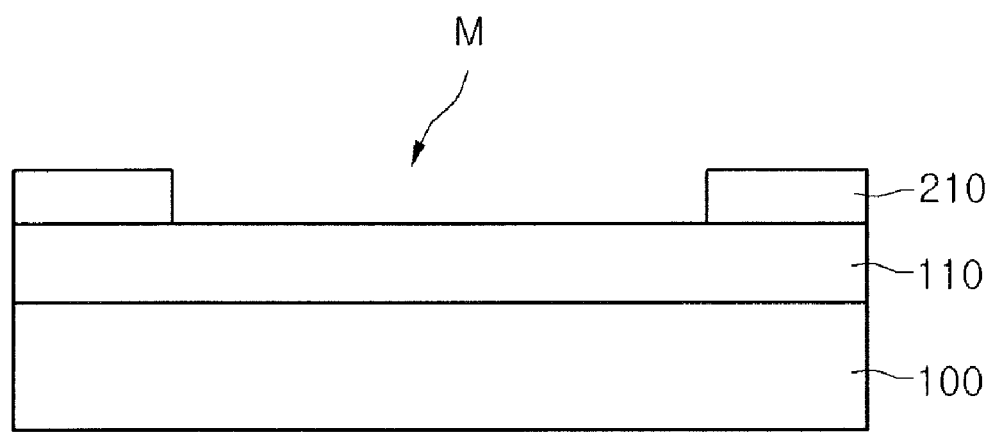

[FIG. 3]
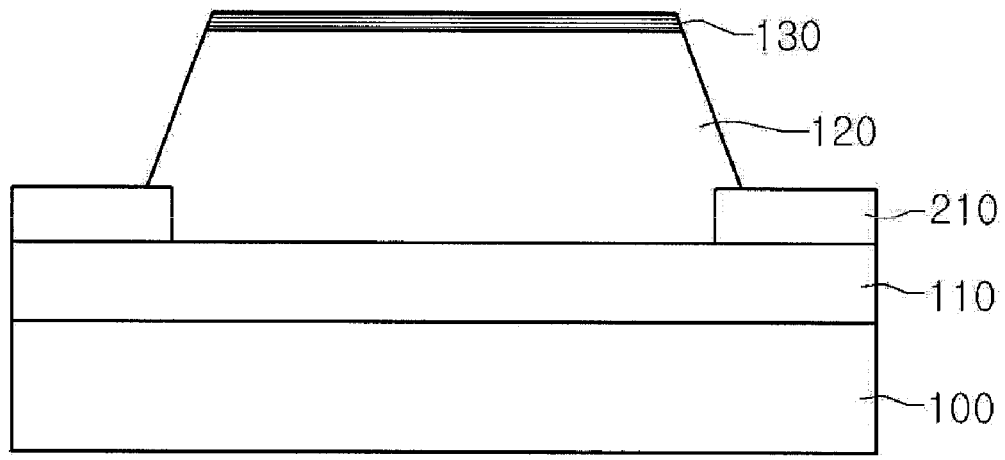
[FIG. 4]
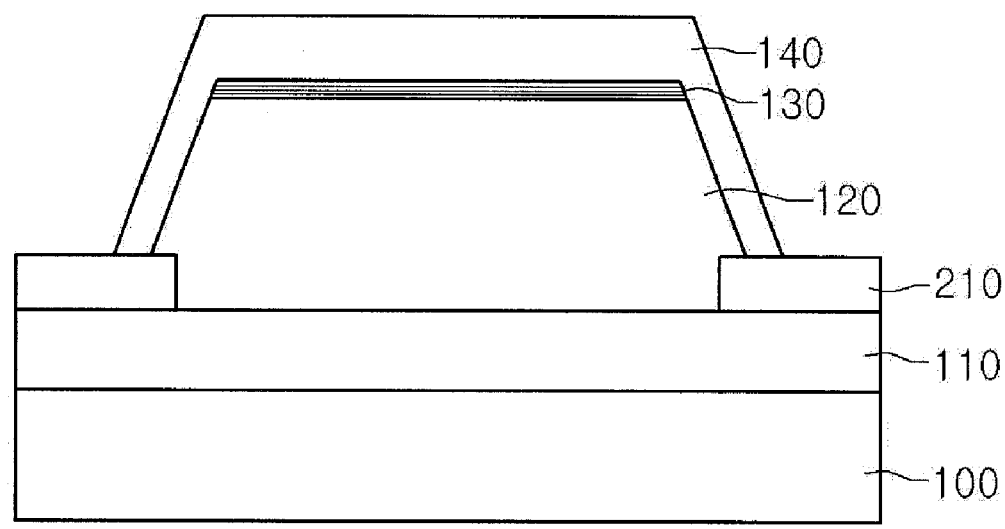

[FIG. 5]
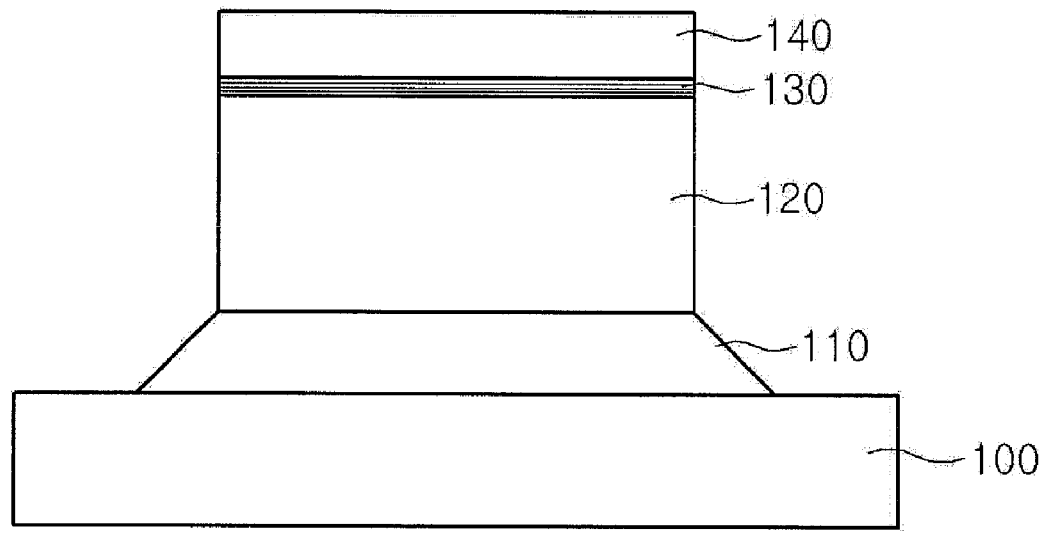
[FIG. 6]
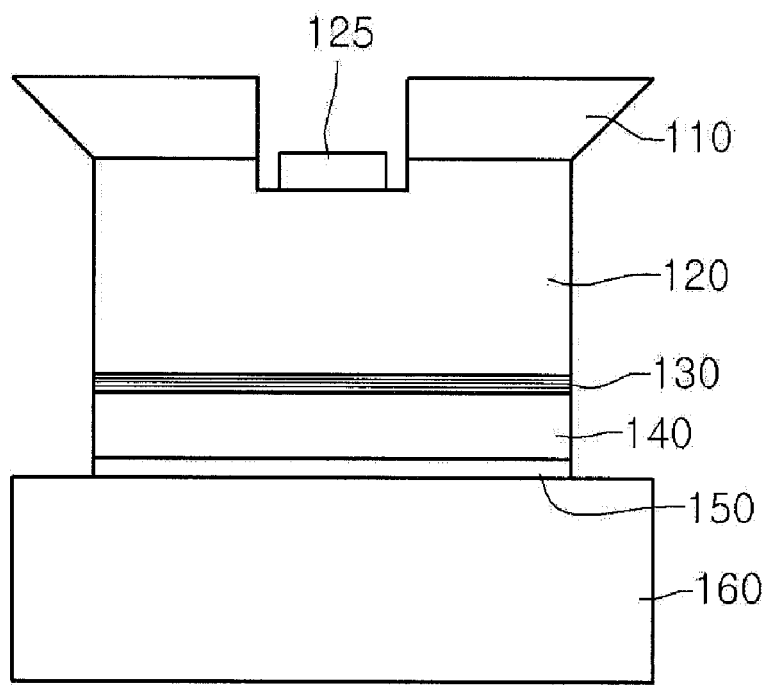

[FIG. 7]
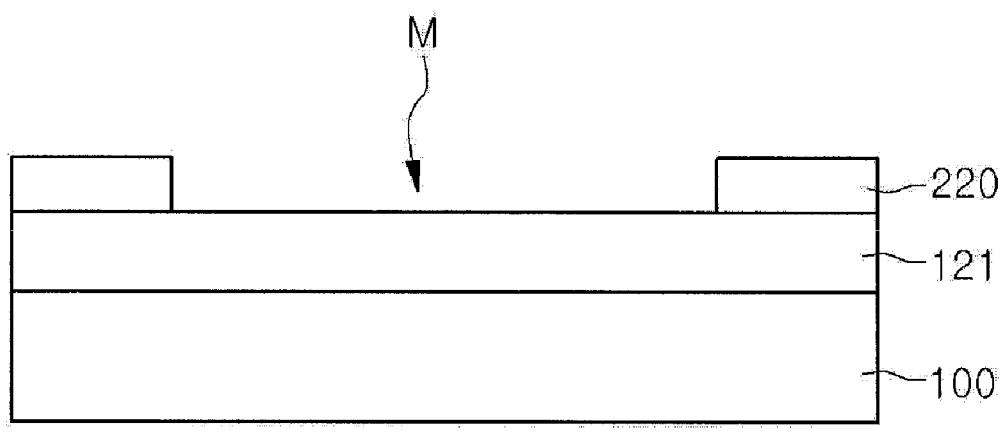
[FIG. 8]
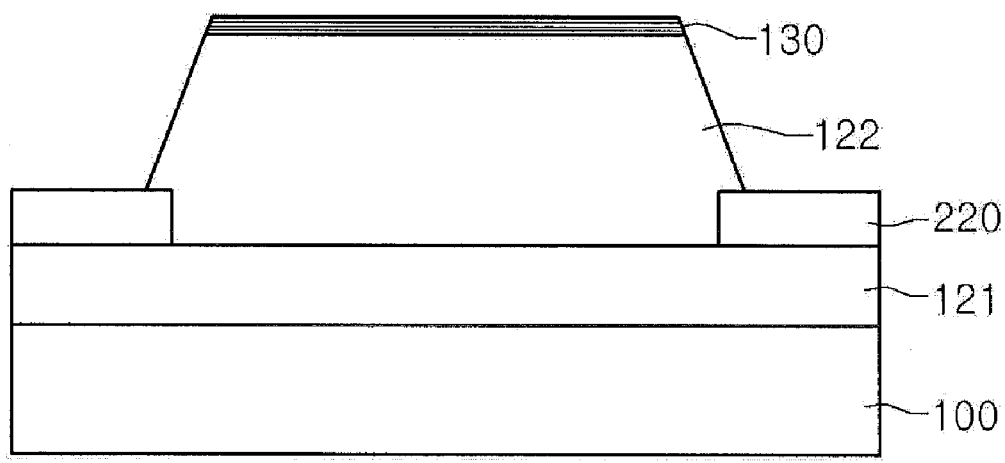

[FIG. 9]
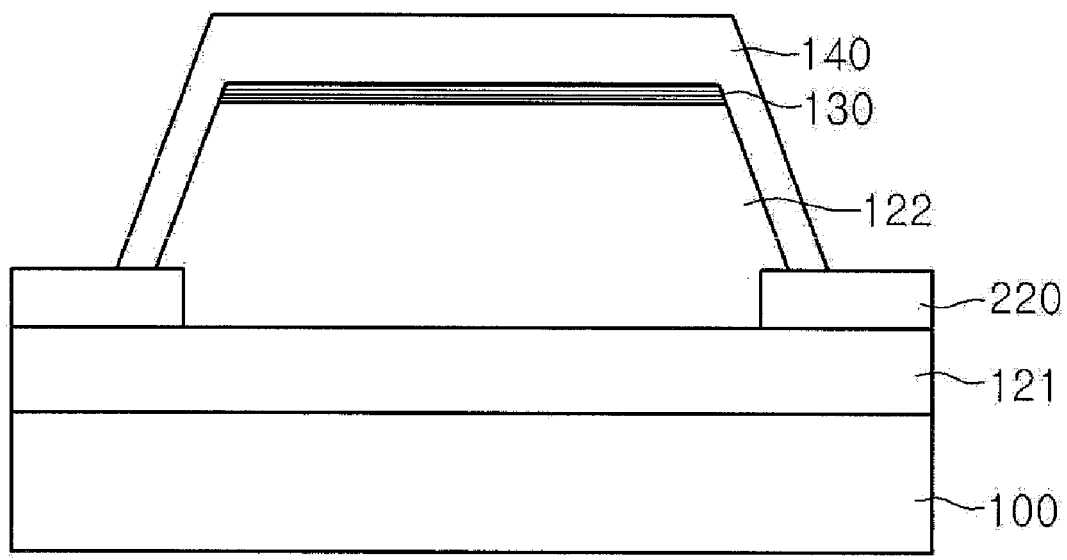
[FIG. 10]
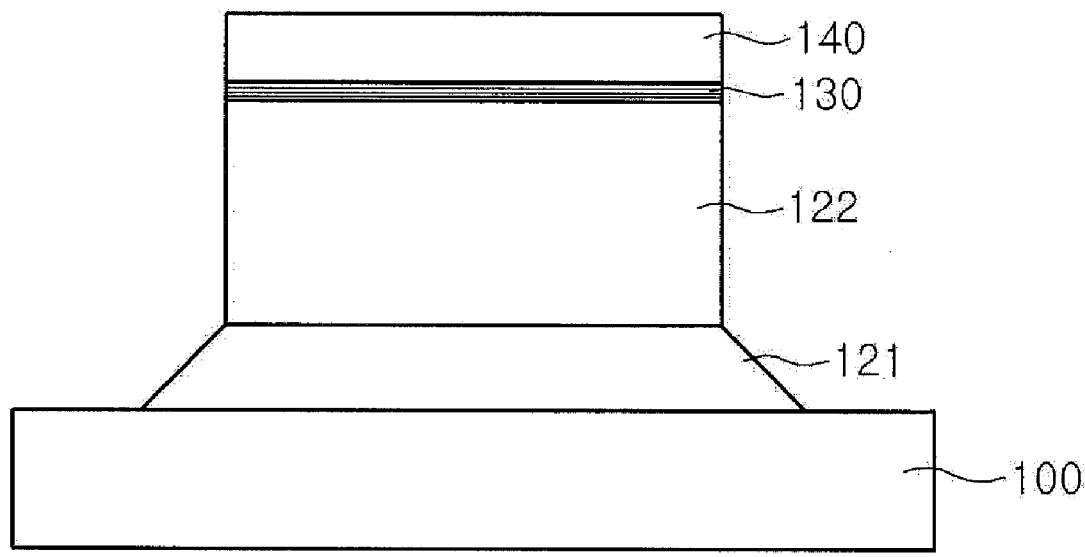

[FIG. 11]
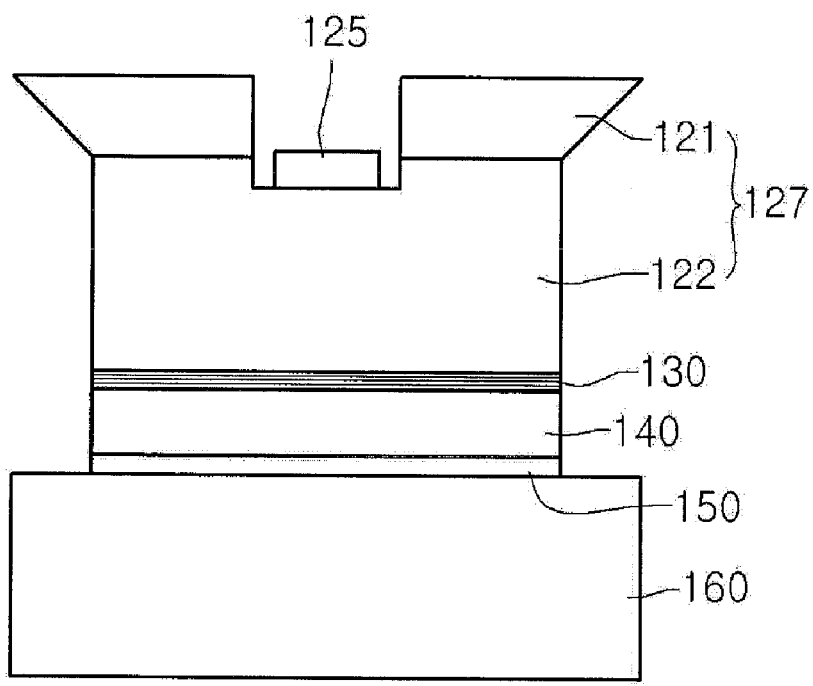
[FIG. 12]
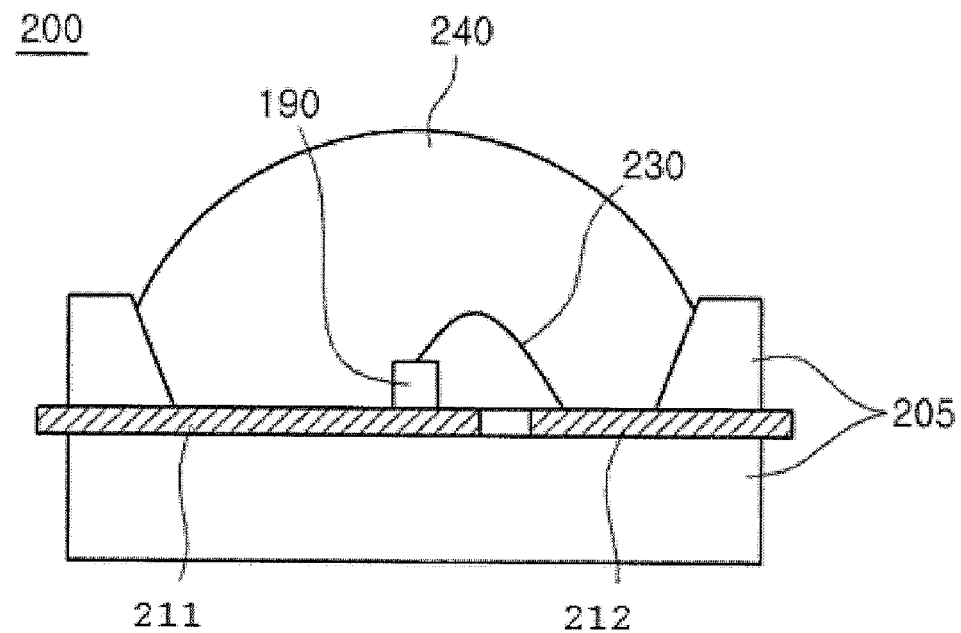

[FIG. 13]
1100
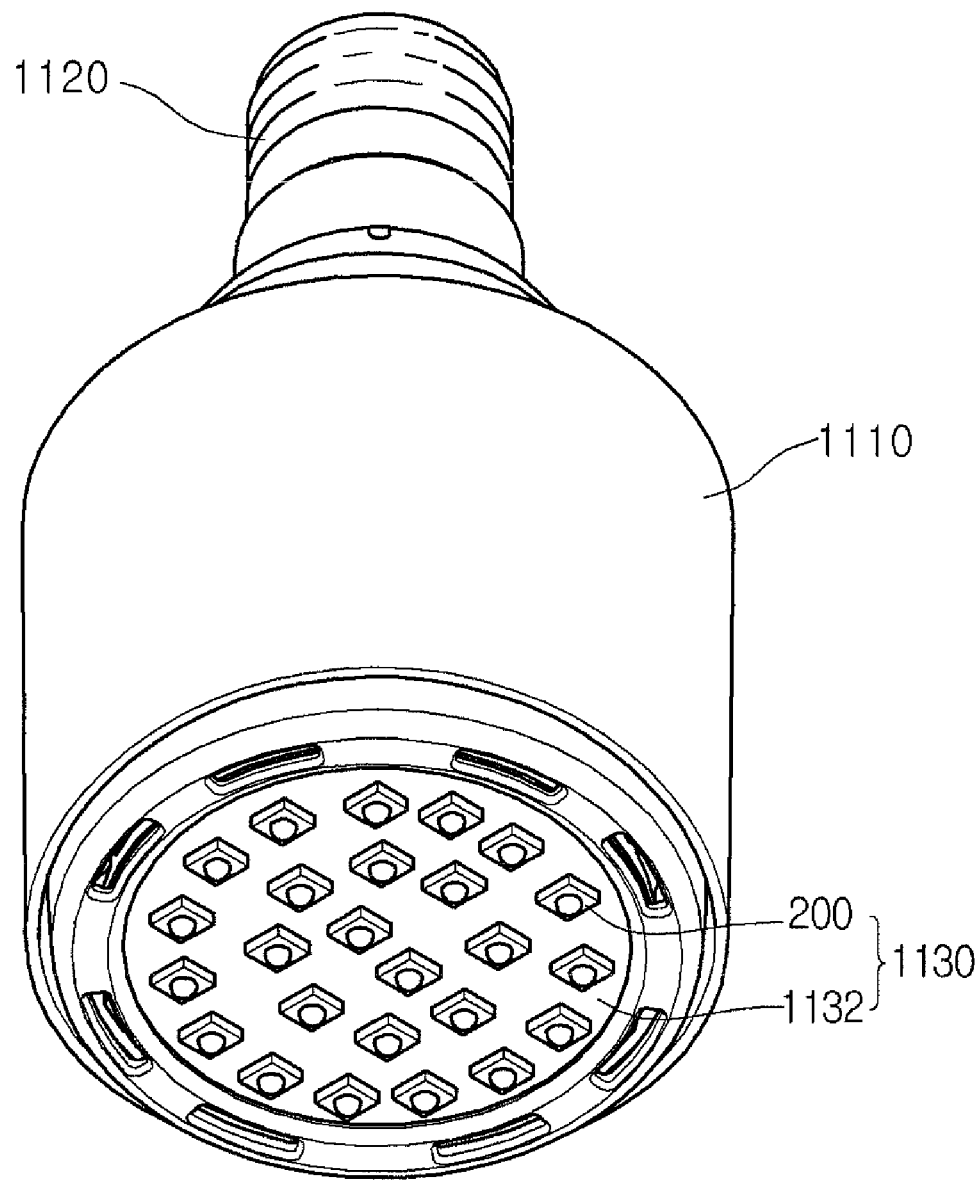

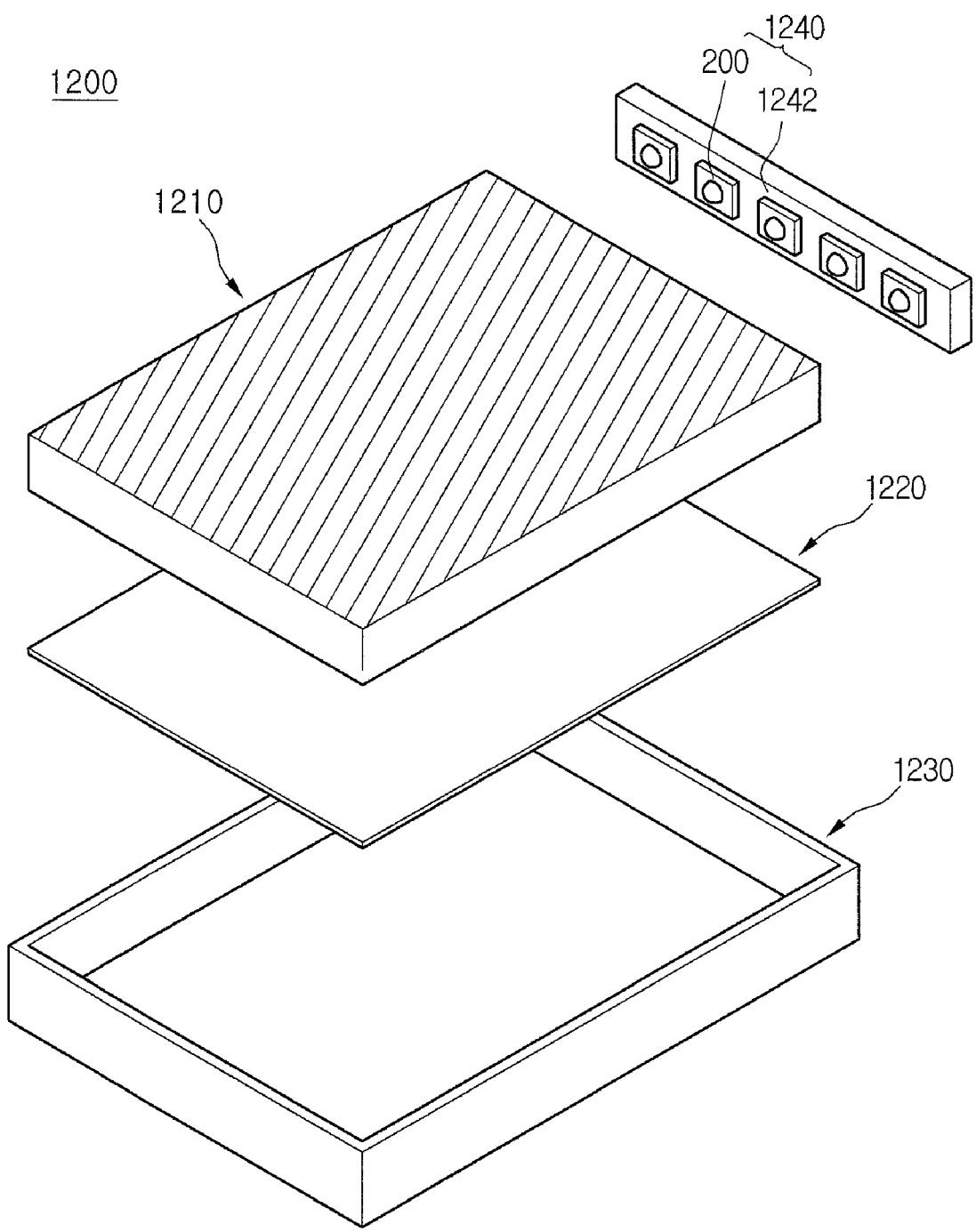
[FIG. 14]

LIGHT EMITTING DEVICE, LIGHT EMITTING DEVICE PACKAGE AND LIGHTING SYSTEM INCLUDING THE SAME

CROSS-REFERENCE TO RELATED APPLICATIONS

This application claims under 35 U.S.C. §119 to Korean Patent Application No. 10-2009-0022055, filed Mar. 16, 2009, which is hereby incorporated by reference in its entirety.

BACKGROUND

Embodiments relate to a light emitting device, a light emitting device package and a lighting system including the same.

Nitride semiconductors are attracting much attention for the fields of optical devices and high-power electronic devices because of their high thermal stability and wide band gap energy. In particular, blue light emitting devices (LEDs), green LEDs, and UV LEDs that use nitride semiconductors have been commercialized and are being widely used.

According to the related art, not only GaN substrates but also heterogeneous substrates formed of different materials (e.g., silicon, sapphire, and silicon carbide (SiC)) are used to grow GaN epitaxial layers. When GaN-based materials are grown on such heterogeneous substrates, many defects such as threading dislocations (TD) are included in the grown thin layer due to the mismatches between crystal lattice coefficients and thermal expansion coefficients.

Also, according to the related art, a dry etching or wet etching-based isolation process is used to provide the isolation between LED chips. However, the LED may be damaged by plasma or chemicals during the etching-based isolation process, thereby degrading the chip reliability.

SUMMARY

Embodiments provide a light emitting device (LED) having low crystal defects, an LED package and a lighting system.

Embodiments also provide an LED including a chip having improved light extraction efficiency, an LED package and a lighting system.

Embodiments also provide an LED in which the number of isolation processes for inter-chip isolation is reduced and light extraction efficiency is improved, an LED package and a lighting system.

In one embodiment, a light emitting device (LED) comprises: a light emitting structure comprising a second conductive type semiconductor layer, an active layer, and a first conductive type semiconductor layer; and a first electrode over the light emitting structure, wherein a portion of the light emitting structure comprises a slope.

In another embodiment, a light emitting device (LED) package comprises: an LED comprising a light emitting structure comprising a second conductive type semiconductor layer, an active layer, and a first conductive type semiconductor layer and a first electrode over the light emitting structure; and a package body comprising the LED, wherein a portion of the light emitting structure comprises a slope.

In further another embodiment, a lighting system comprises a light emitting module comprising a light emitting device (LED) package comprising: an LED comprising a light emitting structure comprising a second conductive type semiconductor layer, an active layer, and a first conductive type semiconductor layer and a first electrode over the light emitting structure; and a package body in which the LED is disposed, wherein a portion of the light emitting structure comprises a slope.

The details of one or more embodiments are set forth in the accompanying drawings and the description below. Other features will be apparent from the description and drawings, and from the claims.

BRIEF DESCRIPTION OF THE DRAWINGS

FIG. 1 is a sectional view of a light emitting device (LED) according to a first embodiment.

FIGS. 2 to 6 are sectional views illustrating a process of fabricating the LED according to the first embodiment.

FIGS. 7 and 11 are sectional views of an LED according to a second embodiment.

FIG. 12 is a sectional view of an LED package according to an embodiment.

FIG. 13 is a perspective view of a lighting unit according to an embodiment.

FIG. 14 is an exploded perspective view of a backlight unit according to an embodiment.

DETAILED DESCRIPTION OF THE EMBODIMENTS

Hereinafter, a light emitting device, a light emitting device package and a lighting system including the same will be described with reference to accompanying drawings.

In the description of embodiments, it will be understood that when a layer (or film) is referred to as being "on/over" another layer or substrate, it can be directly on/over another layer or substrate, or intervening layers may also be present. Further, it will be understood that when a layer is referred to as being "under/below" another layer, it can be directly under/below another layer, and one or more intervening layers may also be present. In addition, it will also be understood that when a layer is referred to as being "between" two layers, it can be the only layer between the two layers, or one or more intervening layers may also be present.

(First Embodiment)

FIG. 1 is a sectional view of a light emitting device (LED) according to a first embodiment.

A light emitting device (LED) 190 according to this embodiment may include a light emitting structure and a first electrode 125 disposed on the light emitting structure. The light emitting structure includes a second conductive type semiconductor layer 140, an active layer 130 disposed on the second conductive type semiconductor layer 140, and a first conductive type semiconductor layer 120 disposed on the active layer 130. The light emitting structure may have a slope. The non-described reference numerals in FIG. 1 will be described later with reference to FIGS. 2 to 5.

According to the LED and a process of fabricating the LED of this embodiment, a selective growth process may be used to grow a GaN-based material with a low crystal defect in an LED structure, thereby providing high internal efficiency, high reliability, and good current spreading.

Also, a path of photons generated in the active layer 130 due to a chip shape obtained by adjusting a slope of a lateral surface of the light emitting structure may be reduced to improve light extraction efficiency.

Also, the selective growth process may be performed to obtain a high-quality semiconductor layer, reduce the number of isolation processes for inter-chip isolation when a vertical type device is fabricated, and improve the light extraction efficiency.

Hereinafter, a process of the LED according to the first embodiment will be described with reference to FIGS. 2 to 6.

Referring to FIG. 2, a first substrate 100 may be prepared. The first substrate 100 may be a sapphire ($Al_2O_3$) monocrystalline substrate, a Si substrate, or a SiC substrate, which include a semiconductor layer and a heterogeneous material, but is not limited thereto. A wet cleaning process may be performed on the first substrate 100 to remove impurities of a surface of the first substrate 100.

A semiconductor layer 110 may be formed on the first substrate 100. For example, an undoped-GaN layer may be formed on the first substrate 100, but is not limited thereto. Since the layer 110 is formed, the growth of the first conductive type semiconductor layer 120 may be improved. In addition, it may prevent crystal defects from extending upward. Further, the semiconductor 110 may be lightly doped semiconductor layer having a doping concentration of $1\times10^{15}$–$5\times10^{15}$ $cm^{-3}$ or below.

A first pattern 210 is formed on the non-conductive semiconductor layer 110 to expose a partial region M thereof. The first pattern 210 may remain in an inter-chip boundary region. For example, the first pattern 210 may be an oxide layer (e.g., $SiO_2$) or a nitride layer, but is not limited thereto. For example, a plasma enhanced chemical vapor deposition (PECVD) process may be used to deposit $SiO_2$, and then, a patterning process may be used to form the first pattern 210 exposing the partial region M.

In the first embodiment, the non-conductive type semiconductor layer 110 may have a crystalline direction different from those of a first conductive type semiconductor layer 120, an active layer 130, and a second conductive type semiconductor layer 140. Thus, the first conductive type semiconductor layer 120, the active layer 130, and the second conductive type semiconductor layer 140 may be etched in a vertical pattern shape, and the non-conductive type semiconductor layer 110 may be etched to remain at a predetermined slope.

Referring to FIG. 3, the first conductive type semiconductor layer 120 is fruited on the exposed nonconductive semiconductor layer 110. For example, a chemical vapor deposition (CVD) process, a molecular beam epitaxy (MBE) process, a sputtering process, or a hydride vapor phase epitaxy (HVPE) process may be used to form an n-type GaN layer for the first conductive type semiconductor layer 120. Also, the first conductive type semiconductor layer 120 may be formed by injecting tri-methyl gallium gas (TMGa), ammonia gas ($NH_3$), nitrogen gas ($N_2$), or silane gas ($SiH_4$) containing n-type impurity such as silicon (Si) into a process chamber.

At this time, the first conductive type semiconductor layer 120 may be laterally grown from a seed region toward the first pattern 210. The first conductive type semiconductor layer 120 on the first pattern 210 has a high-quality crystalline with a little potential.

According to the LED of this embodiment and the method of fabricating the LED, a selective growth process is utilized to grow a GaN-based material with a low crystal defect in an LED structure, thereby providing high internal efficiency, high reliability, and good current spreading.

Also, the selective growth process may be performed to obtain a semiconductor layer having the low crystal defect, reduce the number of isolation processes for inter-chip isolation when a vertical type device is fabricated, and improve the light extraction efficiency.

The active layer 130 is formed on the first conductive type semiconductor layer 120. The active layer 130 may have a quantum well structure that is formed by alternately stacking nitride semiconductor layers with different energy bands once or several times. For example, the active layer 130 may have a multi-quantum well structure with an InGaN/GaN structure that is formed by injecting tri-methyl gallium gas (TMGa), ammonia gas ($NH_3$), nitrogen gas ($N_2$), or tri-methyl indium gas (TMIn), but is not limited thereto.

At this time, the active layer 130 may be formed on a top surface of the first conductive type semiconductor layer 120. For example, a mask pattern (not shown) may be formed on a lateral surface of the first conductive type semiconductor layer 120, and the active layer 130 may be formed on the top surface of the first conductive type semiconductor layer 120.

Referring to FIG. 4, the second conductive type semiconductor layer 140 is formed on the active layer 130 and the first conductive type semiconductor layer 120. For example, the second conductive type semiconductor layer 140 may be formed by injecting tri-methyl gallium gas (TMGa), ammonia gas ($NH_3$), nitrogen gas ($N_2$), or bisethylcyclopentadienyl magnesium ($EtCp_2Mg$){$Mg(C_2H_5C_5H_4)_2$} containing p-type impurity such as magnesium (Mg) into a process chamber, but is not limited thereto.

At this time, the second conductive type semiconductor layer 140 may be formed to surround lateral surfaces of the active layer 130 and the first conductive type semiconductor layer 120.

Referring to FIG. 5, a wet or dry etching process may be performed on lateral surfaces of the second conductive type semiconductor layer 140, the active layer 130, and the first conductive type semiconductor layer 120.

In the etching of the lateral surfaces of the second conductive type semiconductor layer 140, the active layer 130, and the first conductive type semiconductor layer 120, the first pattern 210 may be removed to allow the non-conductive type semiconductor layer 110 to be etched while maintaining a predetermined slope.

According to the first embodiment, when the etching process is performed to adjust the lateral slope of the semiconductor layers 120, 130, and 140 of the grown LED, the first pattern 210 exposed to an etching solution is removed, and also, an undoped GaN that is the non-conductive type semiconductor layer 110 is etched to maintain a predetermined slope. For example, the non-conductive type semiconductor layer 110 may have an angle of about 55°~89°, but is not limited thereto.

Also, according to the first embodiment, a portion of a lateral surface of the GaN grown by removing the first pattern 210 exposed to the etching solution may be etched to maintain a predetermined slope. That is, according to this embodiment, when the selective growth process is performed, various modes of growth planes occur on the lateral surface. Thus, a portion of the growth planes is reacted with the chemical etching solution to form a plane having a predetermined slope. For example, the second conductive type semiconductor layer 140, the active layer 130, and the first conductive type semiconductor layer 120 may be etched to form vertical profiles. The undoped GaN that is the non-conductive type semiconductor layer 110 may be etched to maintain a predetermined slope.

Also, according to the embodiment, the slope of the light emitting structure may include uniform plane or non-uniform plane. For example, the slope may be uniform plane or non-uniform plane depending on etching.

In the first embodiment, a KOH etching solution may be used as the etching solution, but is not limited thereto.

Referring to FIG. 6, a second electrode 150 is formed on the second conductive type semiconductor layer 140. The second electrode 150 may include at least one of an ohmic layer, a reflective layer, and a coupling layer.

For example, the second electrode layer 150 may be a p-type ohmic contact layer 152 and may be formed by multiply stacking a single metal or a metal alloy so as to provide efficient hole injection, but are not limited thereto. The second electrode 150 may be a reflective layer or a transparent layer. For example, when the second electrode 150 is the reflective layer, the second electrode 150 may include a metal layer containing Al, Ag, or an alloy containing Al or Ag.

Also, the second electrode 150 may be formed of at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, and Ni/IrOx/Au/ITO, but is not limited thereto.

A second substrate 160 may be formed on the second electrode 150 so as to efficiently perform removing of the first substrate 100 in a subsequent process. If the first conductive type semiconductor layer 120 has a thick thickness of greater than about 70 μm, the formation process of the second substrate 160 may be omitted.

The second substrate 160 may be formed of a metal having good conductive properties, a metal alloy, or a conductive semiconductor material to efficiently inject the electron holes. For example, the second substrate 160 may be formed of one of more of copper (Cu), a Cu alloy, SiGe, GaN, Si, Ge, GaAs, ZnO, or SiC. The second substrate 160 may be formed using an electrochemical metal deposition method or a bonding method using eutectic metals.

The first substrate 100 is removed. The first substrate 100 may be removed using a high power laser or a chemical etching process. Also, the first substrate 100 may be removed using a physical grinding process. The first substrate 100 is removed to expose the non-conductive type semiconductor layer 110. The exposed non-conductive type semiconductor layer 110 may have subsurface damages generated when the first substrate 100 is removed. The subsurface damages may be removed by performing a wet or dry etching process.

A portion of the non-conductive type semiconductor layer 110 is moved, and a first electrode 125 is formed on the first conductive type semiconductor layer 120. A dry or wet etching process may be performed on a top surface of the non-conductive type semiconductor layer 110 to form a roughness in a region except the first electrode 125.

According to the LED of this embodiment and the method of fabricating the LED, a selective growth process is utilized to grow a GaN-based material with a low crystal defect in an LED structure, thereby providing high internal efficiency, high reliability, and good current spreading.

Also, a path of photons generated in the active layer 130 due to a chip shape obtained by adjusting a slope of a lateral surface may be reduced to improve light extraction efficiency.

Also, the selective growth process may be performed to obtain a semiconductor layer having the low crystal defect, reduce the number of isolation processes for inter-chip isolation when a vertical type device is fabricated, and improve the light extraction efficiency.

(Second Embodiment)

FIG. 11 is a sectional view of an LED according to a second embodiment, and FIGS. 7 and 11 are sectional views of the LED according to the second embodiment.

The second embodiment may adopt the technical features of the first embodiment, and only the parts different from the first embodiment will be mainly described below.

According to a second embodiment, a portion of a first conductive type semiconductor layer 127 of a light emitting structure may be sloped at a predetermined angle. For example, the first conductive type semiconductor layer 127 may include a first conductive type first semiconductor layer 121 and a first conductive type second semiconductor layer 122. Also, the first conductive type first semiconductor layer 121 may have a predetermined slope.

Hereinafter, the second embodiment will be described with reference to FIGS. 7 to 11.

Referring to FIG. 7, a first substrate 100 is prepared. A first conductive type first semiconductor layer 121 may be formed on the first substrate 100. At this time, a non-conductive type semiconductor layer (not shown) may be formed on the substrate 100, but is not limited thereto.

Thereafter, a second pattern 220 is formed on the first conductive type first semiconductor layer 121 to expose a partial region M thereof. The second pattern 210 may remain in an inter-chip boundary region. For example, the second pattern 220 may be an oxide layer (e.g., $SiO_2$) or a nitride layer, but is not limited thereto.

In the first embodiment, the first conductive type first semiconductor layer 121 may have a crystalline direction different from those of a first conductive type second semiconductor layer 122, an active layer 130, and a second conductive type semiconductor layer 140, which will be formed later. Thus, the first conductive type second semiconductor layer 122, the active layer 130, and the second conductive type semiconductor layer 140 may be etched in a vertical pattern shape, and the first conductive type first semiconductor layer 121 may be etched to remain at a predetermined slope.

Referring to FIG. 8, the first conductive type second semiconductor layer 122 is formed on the first conductive type first semiconductor layer 121. At this time, the first conductive type second semiconductor layer 122 may be laterally grown from a seed region toward the second pattern 220. Thereafter, the active layer 130 is formed on the first conductive type second semiconductor layer 122.

Referring to FIG. 9, the second conductive type semiconductor layer 140 is formed on the active layer 130 and the first conductive type semiconductor layer 122. At this time, the second conductive type semiconductor layer 140 may be formed to surround lateral surfaces of the active layer 130 and the first conductive type second semiconductor layer 122.

Referring to FIG. 10, a wet or dry etching process may be performed on lateral surfaces of the second conductive type semiconductor layer 140, the active layer 130, and the first conductive type second semiconductor layer 122.

In the etching of the lateral surfaces of the second conductive type semiconductor layer 140, the active layer 130, and the first conductive type second semiconductor layer 122, the second pattern 220 may be removed to allow the first conductive type first semiconductor layer 121 to be etched while maintaining a predetermined slope.

That is, in the second embodiment, the first conductive type first semiconductor layer 121 may have a crystalline direction different from those of the first conductive type second semiconductor layer 122, the active layer 130, and the second conductive type semiconductor layer 140, which will be formed later. Thus, the first conductive type second semiconductor layer 122, the active layer 130, and the second conductive type semiconductor layer 140 may be etched in a vertical pattern shape, and the first conductive type first semiconductor layer 121 may be etched to remain at a predetermined slope.

Referring to FIG. 11, a second electrode 150 is formed on the second conductive type semiconductor layer 140. For example, the second electrode layer 150 may include an ohmic contact layer (not shown), a reflective layer (not shown), a contact layer (not shown), and a second substrate 160.

The first substrate 100 is removed. The first substrate 100 may be separated using a high power laser or removed using a chemical etching process.

A portion of the first conductive type second semiconductor layer 122 is moved, and a first electrode 125 is formed on the first conductive type second semiconductor layer 122. A dry or wet etching process may be performed on a top surface of the first conductive type first semiconductor layer 121 to form a roughness in a region except the first electrode 125.

According to the LED of this embodiment and the method of fabricating the LED, a selective growth process is utilized to grow a GaN-based material with a low crystal defect in an LED structure, thereby providing high internal efficiency, high reliability, and good current spreading.

Also, a path of photons generated in the active layer 130 due to a chip shape obtained by adjusting a slope of a lateral surface may be reduced to improve light extraction efficiency.

Also, the selective growth process may be performed to obtain a semiconductor layer having the low crystal defect, reduce the number of isolation processes for inter-chip isolation when a vertical type device is fabricated, and improve the light extraction efficiency.

FIG. 12 is a sectional view of an LED package according to an embodiment.

Referring to FIG. 12, an LED package according to an embodiment includes a body 205, a third electrode layer 211 and a fourth electrode layer 212 disposed in the body 205, an LED 190 disposed in the body 205 and electrically connected to the third electrode layer 211 and the fourth electrode layer 212, and a molding member 240 surrounding the LED 190.

The body 205 may be foamed of a silicon material, a synthetic resin material, or a metal material. A sloped surface may be disposed around the LED 190.

The third electrode layer 211 and the fourth electrode layer 212 are electrically separated from each other and supply a power to the LED 190. Also, the third electrode layer 211 and the fourth electrode layer 212 may reflect light generated in the LED 190 to improve light efficiency. In addition, the third electrode layer 211 and the fourth electrode layer 212 may release heat generated in the LED 190 to the outside.

The vertical type LED illustrated in FIG. 1 may be applicable as the LED 190, but is not limited thereto. For example, a lateral type LED may be applicable as the LED 190.

The LED 190 may be disposed on the body 205 or on the third electrode layer 211 or the fourth electrode layer 212.

The LED 190 may be electrically connected to the third electrode layer 211 and/or the fourth electrode layer 212 through a wire 230. In this embodiment, the vertical type LED 190 is explained as an example, and one wire 230 may be used as an example, but are not limited thereto.

The molding member 240 may surround the LED 190 to protect the LED 190. Also, a phosphor may be contained in the molding member 240 to vary a wavelength of light emitted from the LED 190.

The LED package according to an embodiment may be applicable to a lighting system. The lighting system may include a lighting unit illustrated in FIG. 13 and a backlight unit illustrated in FIG. 14. In addition, the lighting system may include traffic lights, a vehicle headlight, and a sign.

FIG. 13 is a perspective view of a lighting unit 1100 according to an embodiment.

Referring to FIG. 13, a lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a substrate 1132 and at least one LED package 200 mounted on the substrate 1132.

A circuit pattern may be printed on an insulation material to form the substrate 1132. For example, the substrate 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

The at least one LED package 200 may be mounted on the substrate 1132. The LED package 200 may include at least one light emitting diode 100. The light emitting diode 100 may include a colored light emitting diode that emits red, green, blue, or white light and an UV light emitting diode that emits ultraviolet (UV) light.

The light emitting module 1130 may include a plurality of light emitting device packages 200 to obtain various colors and brightness. For example, a white LED, a red LED, and a green LED may be disposed in combination with each other to secure a high color rendering index (CRI).

The connection terminal 1120 may be electrically connected to the light emitting module 1130 to supply a power. As shown in FIG. 13, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power using an interconnection.

FIG. 14 is an exploded perspective view of a backlight unit 1200 according to an embodiment.

A backlight unit 1200 according to an embodiment may include a light guide plate 1210, a light emitting module 1240, a reflective member 1220, and a bottom cover 1230, but is not limited thereto. The light emitting module 1240 may provide light to the light guide plate 1210. The reflective member 1220 may be disposed below the light guide plate 1210. The bottom cover 1230 may receive the light guide plate 1210, the light emitting module 1240, and the reflective member 1220.

The light guide plate 1210 diffuses light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 provides light to at least one surface of the light guide plate 1210. Thus, the light emitting module 1240 may be used as a light source of a display device including the backlight unit.

The light emitting module 1240 may contact the light guide plate 1210, but is not limited thereto. In particular, the light emitting module 1240 may include a substrate 1242 and a plurality of light emitting device packages 200 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB (MCPCB) or a flexible PCB (FPCB) as well as the PCB, but is not limited thereto.

A light emitting surface of each of the plurality of light emitting device packages 200 may be spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member 1220 may be formed of one of PET, PC, and PVC resin, but is not limited thereto.

The bottom cover 1230 may receive the light guide plate 1210, the light emitting module 1240, and the reflective member 1220. For this, the bottom cover 1230 may have a box shape with an opened upper side, but is not limited thereto.

The bottom cover 1230 may be formed of a metal material or a resin material. Also, the bottom cover 1230 may be manufactured using a press forming process or an extrusion molding process.

A light emitting device (LED) comprise a first semiconductor layer, an active layer adjacent to the first semiconductor layer, and a second semiconductor layer adjacent to the active layer, the first semiconductor layer being a first conductivity type and the second semiconductor being a second conductivity type. A third semiconductor layer is provided adjacent to the first semiconductor layer. The first semiconductor layer, the active layer, the second semiconductor layer and the third semiconductor layer are formed in a first direction.

The third semiconductor has a planar surface in a second direction, and the planar surface faces the first semiconductor layer. The third semiconductor layer has at least one side surface which is inclined, and an angle of inclination of the at least one side surface of the third semiconductor layer is between the first direction and the second direction. At least one of the first semiconductor layer, the active layer, or the second semiconductor layer has a side surface with an angle of inclination which is greater than the angle of inclination of the at least one side surface of the third semiconductor layer. The first and second directions are perpendicular to each other.

The angle of inclination may be a range between 55°~89°. At least one side surface may be a uniform surface or non-uniform surface. The third semiconductor layer may be an un-doped semiconductor layer or a lightly doped semiconductor layer. If doped, the lightly doped semiconductor layer having a doping concentration of 1–5×1015 cm-3 or below. The third semiconductor layer may be an undoped-GaN layer. The third semiconductor layer may have a width greater than the first semiconductor layer.

A recess may be formed in the third semiconductor layer, and a first electrode may be provided in the recess. The recess may extend into the first semiconductor layer. The height of the recess may be greater than a thickness of the first electrode.

A second electrode may be provided adjacent to the second semiconductor layer. The second electrode may be at least one of an ohmic layer, a reflective layer, and a coupling layer. The second electrode may be formed of at least one of ITO, IZO(In—ZnO), GZO(Ga—ZnO), AZO(Al—ZnO), AGZO (Al—Ga ZnO), IGZO(In—Ga ZnO), IrOx, RuOx, RuOx/ITO, Ni/IrOx/Au, and Ni/IrOx/Au/ITO.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device (LED) comprising:
    a first semiconductor layer,
    an active layer adjacent to the first semiconductor layer,
    a second semiconductor layer adjacent to the active layer, the first semiconductor layer being a first conductivity type and the second semiconductor layer being a second conductivity type; and
    a third semiconductor layer adjacent to the first semiconductor layer such that the first semiconductor layer is between the third semiconductor layer and the active layer, wherein the third semiconductor layer having at least one side surface that is inclined, wherein the third semiconductor layer being the first conductive type,
    wherein the third semiconductor layer of the first conductive type is a GaN type semiconductor layer and the first semiconductor layer of the first conductive type is a GaN type semiconductor layer, and
    wherein the third semiconductor layer of the first conductive type physically contacts the first semiconductor layer of the first conductive type.

2. The LED of claim 1, wherein the at least one side surface of the third semiconductor layer comprises a non-uniform side surface.

3. The LED of claim 1, wherein the third semiconductor layer is a doped semiconductor layer.

4. The LED of claim 1, wherein the third semiconductor layer comprises an undoped-GaN layer.

5. The LED of claim 1, wherein the third semiconductor layer has a width greater than the first semiconductor layer.

6. The LED of claim 1, wherein the first semiconductor layer of the has a crystalline direction that is different from a crystalline direction of the second semiconductor layer.

7. The LED of claim 1, wherein the third semiconductor layer is directly disposed on the first semiconductor layer.

8. The LED of claim 1, wherein the third semiconductor layer comprises a protrusion extend outside thereof.

9. The LED of claim 1, further comprising a second electrode adjacent to the second semiconductor layer.

10. The LED of claim 9, wherein the second electrode comprises at least one of an ohmic layer, a reflective layer, and a coupling layer.

11. The LED of claim 10, wherein the second electrode is formed of at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, and Ni/IrOx/Au/ITO.

12. A light emitting device (LED) package that includes the LED of claim 1, and that includes a package body to house the LED.

13. A lighting system that includes a light emitting module having the light emitting device (LED) package of claim 12.

14. The LED of claim 1, wherein a recess is founed in the third semiconductor layer.

15. The LED of claim 14, wherein the recess extends into the first semiconductor layer, and a first electrode is provided only in the recess.

16. The LED of claim 14, wherein the recess extends into the first semiconductor layer and a first electrode is directly provided in the recess of the first semiconductor layer.

17. A light emitting device (LED) comprising:
a first semiconductor layer;
an active layer under the first semiconductor layer;
a second semiconductor layer under the active layer such that the active layer is between the first semiconductor layer and the second semiconductor layer, the first semiconductor layer being a first conductivity type and the second semiconductor layer being a second conductivity type; and
a third semiconductor layer on the first semiconductor layer such that the first semiconductor layer is between the active layer and the third semiconductor layer, wherein the third semiconductor layer has at least one inclined side surface, and a recess is provided in the third semiconductor layer, wherein the third semiconductor layer being the first conductive type,
wherein the third semiconductor layer is a GaN type semiconductor layer, and the first semiconductor layer is a GaN type semiconductor layer,
wherein the third semiconductor layer of the first conductive type is directly disposed on the first semiconductor layer of the first conductive type.

18. The LED of claim 17, wherein the at least one inclined side surface of the third semiconductor layer includes a non-uniform side surface.

19. The LED of claim 17, wherein the recess extends into the first semiconductor layer, and a first electrode is provided in the recess.

* * * * *